United States Patent [19]

Ochiai et al.

[11] Patent Number: 5,616,164
[45] Date of Patent: Apr. 1, 1997

[54] METHODS FOR MAKING METAL PARTICLE SPHERICAL AND REMOVING OXIDE FILM SOLDER PASTE AND SOLDERING METHOD

[75] Inventors: Masayuki Ochiai; Kaoru Hashimoto; Toshimi Kawahara; Mayumi Ōsumi, all of Kawasaki, Japan

[73] Assignee: Fujitsu Limited, Kawasaki, Japan

[21] Appl. No.: 367,775

[22] Filed: Jan. 3, 1995

Related U.S. Application Data

[63] Continuation of Ser. No. 34,125, Mar. 18, 1993, abandoned.

[30] Foreign Application Priority Data

Mar. 19, 1992 [JP] Japan .................... 4-063031

[51] Int. Cl.$^6$ .................... B22F 1/00; C23G 5/00
[52] U.S. Cl. .................... 75/342; 75/370; 134/2
[58] Field of Search .................... 75/342, 370; 264/15; 134/2

[56] References Cited

U.S. PATENT DOCUMENTS

| | | | |
|---|---|---|---|
| 2,907,104 | 10/1959 | Brown et al. | 228/207 |
| 3,063,099 | 1/1961 | Turner et al. | 75/342 |
| 3,762,965 | 10/1973 | Amin et al. | 148/24 |
| 3,791,027 | 2/1974 | Angelo et al. | 148/23 |
| 4,042,374 | 8/1977 | Rasmussen et al. | 264/15 |
| 4,076,637 | 2/1978 | Hurst | 264/15 |
| 4,243,440 | 1/1981 | Arbib et al. | 148/23 |
| 4,380,518 | 4/1983 | Wydro, Sr. | 264/13 |
| 4,441,924 | 4/1984 | Arbib | 148/24 |
| 4,547,304 | 10/1985 | McEntire et al. | 134/2 |
| 4,701,224 | 10/1987 | Zado | 148/23 |
| 4,759,490 | 7/1988 | Ochiai | 228/124 |
| 4,842,654 | 6/1989 | Shindo et al. | 75/342 |
| 4,872,928 | 10/1989 | Jacobs | 148/24 |
| 4,895,606 | 1/1990 | Jafri | 148/25 |
| 4,904,311 | 2/1990 | Katsutsugu | 148/24 |
| 4,919,729 | 4/1990 | Elmgren et al. | 148/24 |
| 4,921,157 | 5/1990 | Dishon et al. | 228/124 |
| 4,941,929 | 7/1990 | Tecle | 148/24 |
| 4,960,236 | 10/1990 | Hedges et al. | 228/224 |
| 4,995,921 | 2/1991 | Davis et al. | 148/22 |
| 5,062,896 | 11/1991 | Huang et al. | 106/287.19 |
| 5,069,730 | 12/1991 | Dodd et al. | 148/23 |
| 5,127,968 | 7/1992 | Gomi et al. | 148/23 |
| 5,139,704 | 8/1992 | Holland et al. | 252/521 |
| 5,150,832 | 9/1992 | Degani et al. | 228/224 |

FOREIGN PATENT DOCUMENTS

| | | |
|---|---|---|
| 0023107A1 | 10/1979 | European Pat. Off. . |
| 51-22067 | 2/1976 | Japan . |

OTHER PUBLICATIONS

Derwent Abstract of JP-53-089847, dated Aug. 8, 1978.
Patent Abstracts of Japan of JP-54-158354, dated Dec. 14, 1979.
Patent Abstracts of Japan of JP-62-174932, dated Jul. 31, 1987.
Patent Abstracts of Japan of JP-63-126689, dated May 30, 1988.
Patent Abstracts of Japan of JP-2-290693, dated Nov. 30, 1990.
Patent Abstracts of Japan, vol. 14, No. 436 (M-1027), 18 Sep. 1990, No. 2-175095.
WPI Accession No. 89-154942/21 and JP 1-95897, Apr. 1989.

*Primary Examiner*—George Wyszomierski
*Attorney, Agent, or Firm*—Armstrong, Westerman, Hattori, McLeland & Naughton

[57] ABSTRACT

Metal such as solder is immersed in a heating medium containing a rosin or derivative thereof and an organic solvent and heated to a temperature above the melting point of the metal, to remove the oxide film of the metal and make the metal spherical. If a hardened caster oil or high softening point rosin or derivative thereof is further added as a thickener to the heating medium, the size increase of the metal particle can be prevented. By heating at a temperature lower than the melting point of the metal, the oxide film can be removed without making the particles spherical. Using thus obtained solder particles, fluxless soldering can be done. Also, a fluxless soldering method is provided.

14 Claims, 10 Drawing Sheets

MIXING

Fig. 8B

PRINTING

Fig. 8C

HEATING

METHODS FOR MAKING METAL PARTICLE SPHERICAL AND REMOVING OXIDE FILM SOLDER PASTE AND SOLDERING METHOD

This application is a continuation of application Ser. No. 08/034,125, filed Mar. 18,1993, abandoned.

BACKGROUND OF THE INVENTION

1. Field of the Invention

The present invention relates to methods for making metal particles spherical and removing an oxide film from a metal, a solder paste and a soldering method. In the fields of manufacture of electronic devices and parts, recent demands for high density packaging require solder pastes and balls and soldering methods which permit fine pattern metal masks to be used and have good soldering properties.

2. Description of the Related Art

In conventional solder pastes, solder particles are changed from a non-spherical shape to a spherical shape to permit a fine pattern printing.

Manufacture of solder particles is typically an atomizing method in which a melted solder is atomized. When solders are manufactured by atomization, the resultant solder particles are usually non-spherical and have a relatively thick oxide film on the surface thereof formed during solidification of the atomized melted solder. The formation of the oxide film can be suppressed by atomization of a solder in a non-oxidizing atmosphere but this non-oxidizing atmosphere with a lower oxygen concentration necessitates a large scale apparatus and the production cost is increased. Accordingly, the present invention has a first object to provide a method for converting non-spherical solder particles having a relatively thick oxide film formed by atomization to spherical tarnish-free solder particles (spherical solder particles without an oxide film).

When a solder paste comprising spherical solder particles is formulated, the solder paste is undesirably moved or flown during or after metal mask printing. To solve this problem, irregular shaped particles may be combined with the spherical solder particles in the solder paste. Nevertheless, changing fine spherical tarnish-free solder particles, which can be manufactured by a process-provided by the present invention, to irregular shaped particles by machining as a practical basis is difficult. On the other hand, if irregular shaped solder particles manufactured by atomization are used, the irregular shaped solder particles have a relatively thick oxide film, as mentioned above, and the shelf life of the solder paste becomes remarkably shortened.

Therefore, the second object of the present invention is to provide a method for converting irregular shaped solder particles having a relatively thick oxide film formed by atomization to tarnish-free solder particles, the solder particles retaining the original or irregular shape.

A solder paste is a mixture of solder particles and a flux vehicle. The flux vehicle has a function of permitting the solder paste to be supplied by printing, dispensing, etc. Specifically, the flux vehicle usually comprises rosin, an activator or fluxing agent, an organic solvent and hardened caster oil. The activator is added to decompose and remove an oxide film existing on a portion where a soldering is to be conducted and is typically amine hydrohalogenide such as diethylamine hydrochloride, which must be removed by a cleaning solvent after the soldering. The rosin is added to shield the portion to be soldered from the exterior and maintain a non-oxidizing atmosphere. The organic solvent is a vehicle to dissolve and supply the rosin and activator to the portion to be soldered and is typically diethylene glycol monoethyl ether (b.p. 201.9° C. ). Most organic solvent is evaporated during a preheating step of soldering and may not exist when soldering is being conducted.

If an activator or fluxing agent is not contained in the flux vehicle, the thick oxide film of solder particles formed during manufacture of the particles cannot be decomposed during soldering so that the solder particles remain on the portion to be soldered as large solder balls and good soldering cannot be conducted. Accordingly, undecomposed activator remains in a remaining flux vehicle after the completion of the soldering and, if it is not removed by cleaning, it corrodes the soldered portion and lowers the reliability of the device. Nevertheless, in recent bare chip packaging, i.e., where LSI chips are soldered directly onto a circuit board, soldering portions have a size or diameter of about 100 μm and a gap between the LSI chips and circuit board is only about 70 μm, which makes the flux cleaning after soldering difficult.

Accordingly, the third and fourth objects of the present invention are to provide a solder paste and soldering method in which flux cleaning after soldering is not necessary.

DESCRIPTION OF THE INVENTION

The above first object of the present invention is attained in accordance with the present invention by providing a method for making a metal particle spherical, comprising immersing a (non-spherical) metal particle in a heating medium containing a rosin or derivative thereof and an organic solvent, the (non-spherical) metal particle having a melting point and the organic solvent preferably having a boiling point higher than the melting point of the metal particle, and heating the metal particle in the heating medium to a temperature above the melting point of the metal particle.

The rosin or derivative thereof has a fluxing activity, i.e., an oxide film removing activity. If metal particles are heated in the heating medium containing a rosin or derivative thereof to a temperature above the melting point of the metal, the thick oxide film on the surface of the metal particles is first removed and then, the metal particles are made spherical due to the surface tension.

The metal that can be applied to the present invention must have a melting point lower than the evaporating or decomposing temperature of the rosin or derivative thereof, because the treatment of removing an oxide film and making the metal particles spherical is conducted in a liquid phase of the rosin or derivative thereof.

Although any organic solvent that allows the metal particles to be mixed to the heating medium can be used in the present invention, the organic solvent preferably has a boiling point higher than the melting point of the metal. If the organic solvent has a boiling point higher than the melting point of the metal and is not evaporated during the above heating, the spherical metal particles can be easily taken from the rosin or derivative thereof after solidification thereof. If an organic solvent having a boiling point lower than the melting point of the metal particles is used, the metal particles can be taken from the solidified heating medium, more specifically a solid rosin or derivative thereof, with an additional organic solvent such as tetrahydrofuran. After the separation of the metal particles from the heating medium, the metal particles are cleaned with another organic solvent such as tetrahydrofuran.

The organic solvents that may be preferably used in combination with specific metal particles, typically solder powders, include polyalcohols such as diethylene glycol mono-n-butylether (b.p., 230.4° C.), ethylene glycol monoethyl ether acetate (b.p., 156.4° C.) and diethylene glycol monoethyl ether (b.p., 201.9° C.).

The ratio of the amount of the rosin or derivative thereof to the amount of the organic solvent cannot be defined, because it depends on the kind of rosin or derivative thereof used and organic solvent. It is, however, necessary that a heating medium of a mixture of a rosin or derivative thereof and an organic solvent can be mixed with metal particles at room temperature. If the rosin has a high molecular weight, the content of the rosin should be low.

The metal particles to which the present invention is applicable include solder particles used in the semiconductor device industry, for example, InSn such as In-48Sn (m.p., 117° C.), SnPb such as Sn-37Pb (m.p., 183° C.), PbSn such as Pb-5Sn (m.p., 300°–314° C.), InPb such as In-40Pb (m.p.,170–180° C. ) and In (m.p.,156° C.).

The ratio of the amount of the metal particles to the amount of the heating medium cannot be defined because it depends on the bottom area of a treatment tank for the heating medium, the amount of the metal particles, the properties of the heating medium, and so on. To the metal particles resting on the bottom of the treatment tank, the weight of the solder particles present in an upper portion of the treatment tank are added so that the particle size of the metal particles tend to be increased. To prevent this, the area of the bottom of the tank should be increased; a high softening point rosin should be used as the rosin in the heating medium; or other measures should be taken.

The heating temperature is above the melting point of the metal particles and below the evaporation or decomposing temperature of the rosin or derivative thereof.

The above method is effective to obtain spherical tarnish-free metal particles. Nevertheless, the metal particles are easily melted together or unified and the particle size thereof increases. Accordingly, it is desired to develop a method in which the increase of the particle size is prevented. This can be accomplished by modifying the composition of the heating medium.

More specifically, in accordance with the present invention, there is provided a method for making metal particles spherical, comprising immersing a (non-spherical) metal particle in a heating medium containing a rosin or derivative thereof, a hardened caster oil and an organic solvent, the (non-spherical) metal particle having a melting point and the organic solvent preferably having a boiling point higher than the melting point of the metal particle, and heating the metal particle in the heating medium to a temperature above the melting point of the metal particle; and a method for making a metal particle spherical, comprising immersing a (non-spherical) metal particle in a heating medium containing at least two of rosins and derivatives thereof having substantially different softening points and an organic solvent, the (non-spherical) metal particle having a melting point and the organic solvent preferably having a boiling point higher than the melting point of the metal particle, and heating the metal particle in the heating medium to a temperature above the melting point of the metal particle.

Namely, the increase of the particle size of the metal particles can be prevented or suppressed if the heating medium maintains a high viscosity when heated to a temperature above the melting point of the metal particles. In this case, the metal particles are made spherical by the surface tension but are not melted together or unified.

The low softening point rosin or derivative thereof is essential to remove the oxide film. Here, the low softening point refers to a softening point of the order of about 80° C. A heating medium containing this rosin and an organic solvent must have an activity that can remove oxide films. A hardened caster oil or a high softening point rosin or derivative thereof is used to maintain the necessary viscosity or is used as a thickener. The hardened caster oil has a melting point of around 90° C. although it depends on the degree of the unsaturation, and the high softening point rosin or derivative thereof refers to a softening point of about 100° C. or higher. It is desired that this high softening point rosin or derivative thereof has a low fluxing activity.

The amount of the hardened caster oil or high softening point rosin or derivative thereof cannot be defined because it depends on factors such as the bottom area of the treatment tank, the amount of the metal particles to be treated, the properties of the heating medium, etc. As described above, particles resting on the bottom of the tank tend to be melted together or increased in size due to the weights from the particles above them. This can be prevented by increasing the amount of the hardened caster oil or high softening point rosin or derivative thereof, but it should be noted that, if the amount thereof is increased, the viscosity of the heating medium is increased and the mixing of the metal particles becomes difficult.

The second object of the present invention is attained in accordance with the present invention by a method for removing an oxide film of a metal, comprising immersing a metal in a heating medium containing a rosin or derivative thereof, an organic solvent and an activator, the metal having a melting point and the organic solvent preferably having a boiling point higher than the melting point of the metal, and heating the metal in the heating medium to a temperature below the melting point of the metal.

Namely, the oxide film of a metal can be removed without making the metal spherical, by heating the metal in a heating medium to a temperature below the melting point of the metal. However, an activator or fluxing agent such as amine hydrohalogenide and organic acids is added to supplement the lowered oxide film removing or fluxing activity of the rosin or derivative thereof at a low heating temperature. The amount of the added activator cannot be defined because it depends on the type of the oxide film on the metal and other factors.

The metal to be treated may be any shape including a particle and sheet (e.g. solder sheet). Although this embodiment is directed to treating a metal having a non-spherical shape, a spherical metal can be also treated in this embodiment to remove the oxide film.

Alternatively, the above second object can be also attained by a method for removing an oxide film of a metal, comprising immersing a metal having a melting point higher than 280° C. in a heating medium containing a rosin or derivative thereof in alcohol, the heating medium not containing an activator, and heating the metal in the heating medium to a temperature below the melting point of the metal.

It was found that a solution of a rosin or derivative thereof in alcohol can have an activity of removing an oxide film at a relatively high temperature such as above 250° C., even without an activator. Accordingly, when a metal has a melting point above 280° C., the oxide film of the metal can be removed by heating in a solution of rosin or derivative in alcohol to a temperature such as 250° to 280° C. even below the melting point of the metal.

The term "melting point" of a metal or solder is used in this application but, when the metal is a solid solution such as typical solders, the solid solution does not have a definite melting point and, therefore, the term "melting point" of the metal should be understood to refer to a temperature at which the solid solution releases a substantial amount of a liquid, typically, a temperature between the solidus line and the liquidus line in the phase diagram.

The metal that has a melting point above 280° C. includes Au-20Sn (280° C.), Pb-3.5Ag-1.5Sn (300°–309° C.) and Pb-5Sn (300–314° C.). This type of a metal having a relatively high melting point is often needed as a solder for use when two or more solderings at substantially different temperatures are necessary to assemble a circuit board, i.e., when a solder paste having a high soldering temperature is necessary in addition to a low temperature solder paste.

The combination of the rosin or derivative thereof and alcohol used may include, for example, Au-20Sn (m.p., 280° C.) and glycerol (b.p. 290° C.) or tetraethylene glycol (b.p. 327° C.); Pb-3.5Ag-1.5Sn (m.p., 300–309° C.) and tetraethylene glycol (b.p. 327° C.); Pb-5Sn (m.p., 300°–314° C.) and tetraethylene glycol (b.p. 327° C.); Sn-37Pb (m.p., 183° C.) and diethylene glycol monoethyl ether (b.p. 201.9° C.) or ethylene glycol monohexyl ether. If some alcohols such as glycerol or tetraethylene glycol do not dissolve the rosin or derivative thereof, an organic solvent is further added.

When the solder particles which have been subject to the above oxide film removing treatment and thus have a tarnish-free surface are used for forming a solder paste formulation, the solder paste has an elongated shelf life in comparison with the conventional solder pastes. If a conventional solder paste is stored for a time, the oxide film on the surface of the solder particles will be dissolved by an activator such as amine hydrohalogenide, to thereby make the paste viscous or thicker and make the printing of the solder paste difficult (short shelf life). In contrast, when the solder particles produced by the method of the present invention are used to form a solder paste, the solder paste does not become viscous or thicker even after it is stored for a long time because the solder particles do not have an oxide film which makes the paste viscous or thicker.

It is noted that the particle size of the metal particles produced by any one of the methods of the present invention can be further controlled by screening, etc., if desired.

The third object of the present invention is attained by providing a solder paste comprising solder particles and a flux vehicle, the solder particles having been subject to an oxide film removing treatment, the flux vehicle containing a rosin or derivative thereof, an organic solvent and a hardened caster oil without an activator or fluxing agent.

Namely, solder particles which have been subject to an oxide film removal treatment are used, to eliminate an activator from a solder paste, since the function of the activator is to decompose an oxide film. The solder particles which have been subject to an oxide film removal treatment may have a very thin oxide film since it may be formed even at room temperature. When such solder particles are used, an activator is not necessary and soldering can be effected with rosin or derivative thereof having a weak oxide film decomposing activity.

A solder paste without an activator is also provided comprising solder particles and an organic solvent, the solder particles having been subject to an oxide film removing treatment and having a melting point, the organic solvent having a boiling point higher than the melting point of the solder. If the oxide film is not present, soldering can be conducted without an activator, therefore, cleaning of the activator is not necessary after soldering.

The organic solvent having a boiling point higher than the melting point of the solder is used to protect the solder from oxidation and will be evaporated when heated to a temperature above the boiling point of the organic solvent.

Here, if the solder is a solid solution not having a definite melting point, the organic solvent should have a boiling point higher than the solidus line of the solder in the phase diagram, preferably higher than a temperature of the solidus line plus 20° C., to ensure the organic solvent protects the solder from the undesired oxidation.

The fourth object of the present invention is attained by providing a method for soldering, comprising the steps of applying a solder onto a first part to be soldered and removing an oxide film from the solder formed on the first part, the solder having a melting point, coating the solder on the first part with an organic solvent having a boiling point higher than the melting point of the solder, contacting a second part to be soldered with the solder on the first part, and heating the solder coated with the organic solvent to bond the first and second parts with the solder.

In this method, generally, solder bumps or pre-solderings are first formed on a part to be soldered and the oxide films on the surfaces of the solder bumps or pre-solderings are cleaned or removed by a flux; as mentioned before, when the cleaned solder bumps or pre-solderings are allowed to stand in the air at room temperature, a very thin oxide film may be formed on the surface of the cleaned solder bumps or pre-solderings, but this very thin oxide film (native oxide film) does not cause a problem for soldering and only a relatively thick oxide film formed at a relatively high temperature such as when being heated in manufacture of solder particles is undesirable for the soldering.

Next, the solder bumps or pre-solderings are coated with an organic solvent having a boiling point higher than the melting point of the solder. The organic solvent will not be evaporated up to a temperature above the melting point of the solder so that, when heated for soldering, the oxidation of the solder particles is prevented, i.e, soldering capability is ensured by preventing an oxidation of the solder particles without an activator.

Accordingly, when the other part to be soldered is brought into contact with the solder bumps or pre-solderings and an assembly comprising the first and second parts and the solder bumps or pre-solderings is heated up to a temperature above the boiling point of the organic solvent, the soldering or bonding between the parts is accomplished and the organic solvent is evaporated and disappears.

Although not limited thereto, this embodiment is preferably applicable to, for example, a solder having a melting point or melting point of 280° to 320° C. where the heating is conducted to a temperature of 330° C. or higher, more preferably 350° C. or higher.

EXAMPLES

Example 1

A heating medium having the following composition was used.

|  | parts by weight |
|---|---|
| Low softening point rosin: (Harimac FX-25; s.p., 72 to 82° C.) | 40 |
| Organic solvent: (diethylene glycol mono-n-butylether, b.p., 230.4° C.) | 20 |

The used solder particles were In-48Sn (m.p., 117° C.; an average particle size 20 μm ), Sn-37Pb (m.p., an average particle size 20 μm ), and In-40Pb (m.p., 170°–180° C.; an average particle size 20 μm ), all of which were manufactured by the atomization method.

50 g of each solder was added and mixed with 30 g of the heating medium and the obtained mixture was heated to a temperature of 155° C. for the In-48Sn solder or 215° C. for Sn-37Pb or In-40Pb.

After the heating, the heating medium was removed with an organic solvent.

Figure 1A:
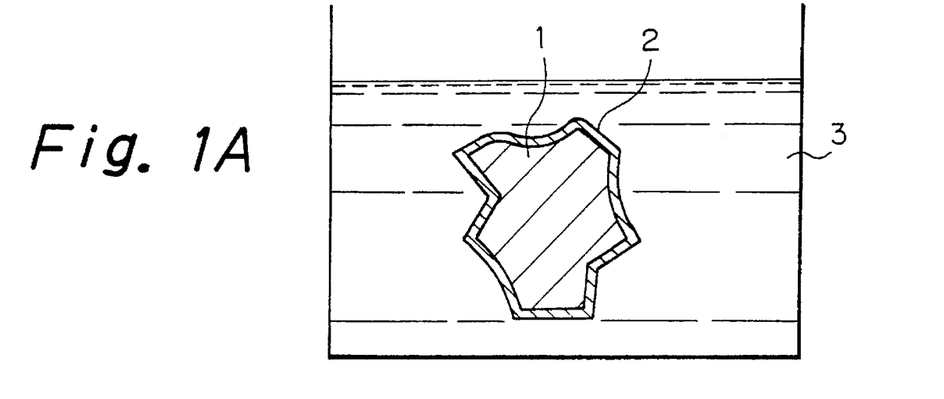
FIGS. 1A, 1B, and 1C show the oxide film-removing treatment in Example 1.
Figure 1B:
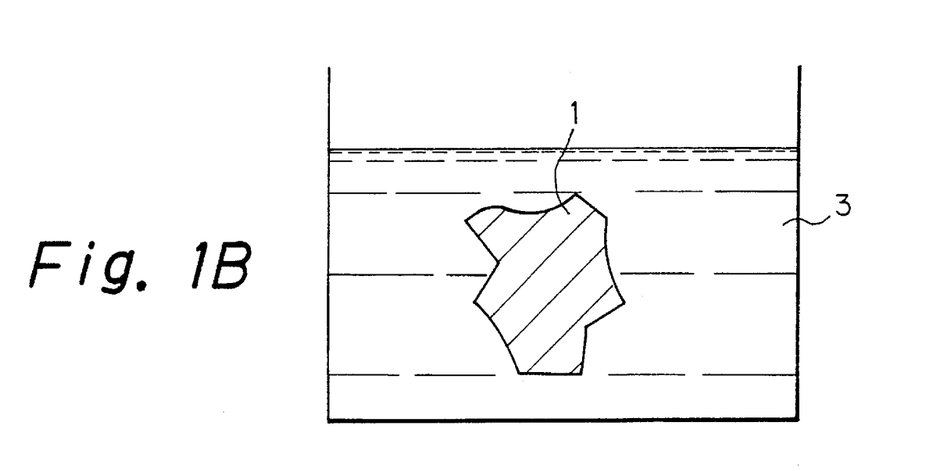
Figure 1C:
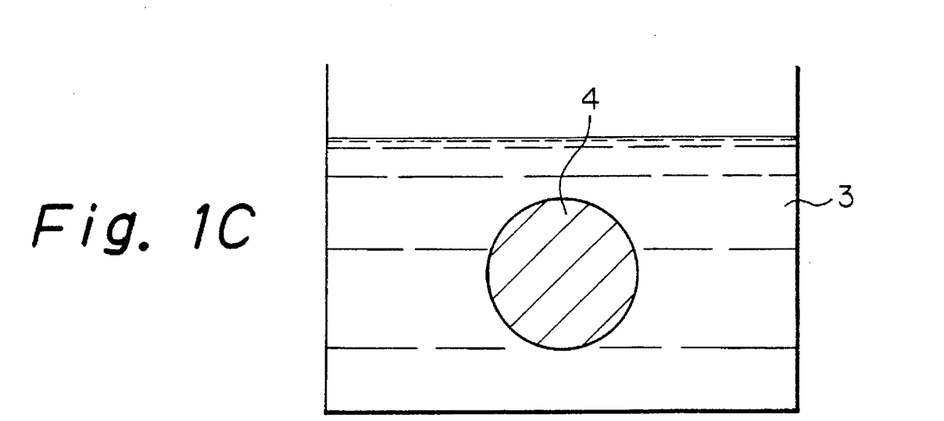

As shown in FIG. 1A, when the non-spherical solder particles 1 are heated in a heating medium 3 having an oxide film decomposing activity, the relatively thick oxide film 2 formed on the surface of the solder particles 1 was decomposed as shown in FIG. 1B. The solder particles 1 whose oxide film was removed were then transformed into a spherical shape by the surface tension, as shown in FIG. 1C.

In all above cases and cases where the particle size was varied, the non-spherical particles were changed to spherical particles and the oxide films were removed.

Example 2

Example 1 was repeated but the heating medium had the following composition:

|  | parts by weight |
|---|---|
| Low softening point rosin: (Harimac FX-25; s.p., 72 to 82° C.) | 40 |
| Hardened caster oil (thickener) | 1 |
| Organic solvent: (ethylene glycol monoethyl ether acetate b.p., 156.4° C.) | 20 |

In all above cases and cases where the particle size was varied, the non-spherical particles were changed to spherical particles, the oxide film was removed, and the particle size increase was decreased.

Example 3

Example 1 was repeated but the heating medium had the following composition:

|  | parts by weight |
|---|---|
| Low softening point rosin: (Harimac FX-25; s.p., 72 to 82° C.) | 40 |
| High softening point rosin: (Harimac AS-5; s.p., 155 to 165° C.) | 30 |
| Organic solvent: (diethylene glycol mono-n-buthyl ether b.p., 230.4° C. | 20 |

In all above cases and cases where the particle size was varied, the non-spherical particles were changed to spherical particles, the oxide film was removed, and the particle size increase was not observed.

Example 4

Example 1 was repeated but the heating medium had the following composition:

|  | parts by weight |
|---|---|
| Rosin (Hariester KT-2; s.p., 177 to 185° C.) | 40 |
| Organic solvent: (diethylene glycol monoethyl ether b.p., 201.9° C.) | 20 |
| Hardened caster oil (thickener) | 2 |
| Activator: (aryl amine hydrochloride m.p., 110° C.) | 1 |

Figure 2A:
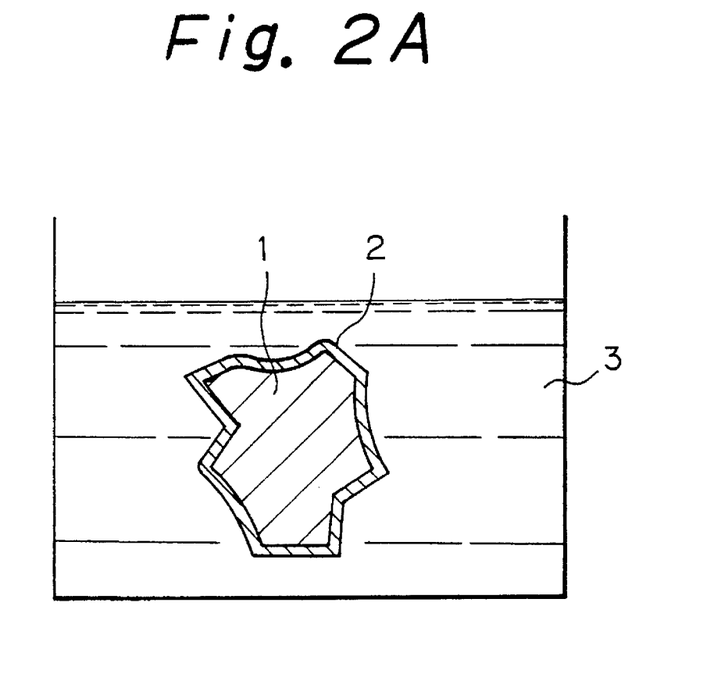
FIGS. 2A and 2B show the oxide film-removing treatment in Example 4.

As shown in FIG. 2A, 50 g of each solder 1 was added and mixed with 50 g of the heating medium 3 and the mixture was heated to a temperature of 100° C. for In-48Sn, 155° C. for Sn-37Pb or 155° C. for In-40Pb.

Figure 2B:
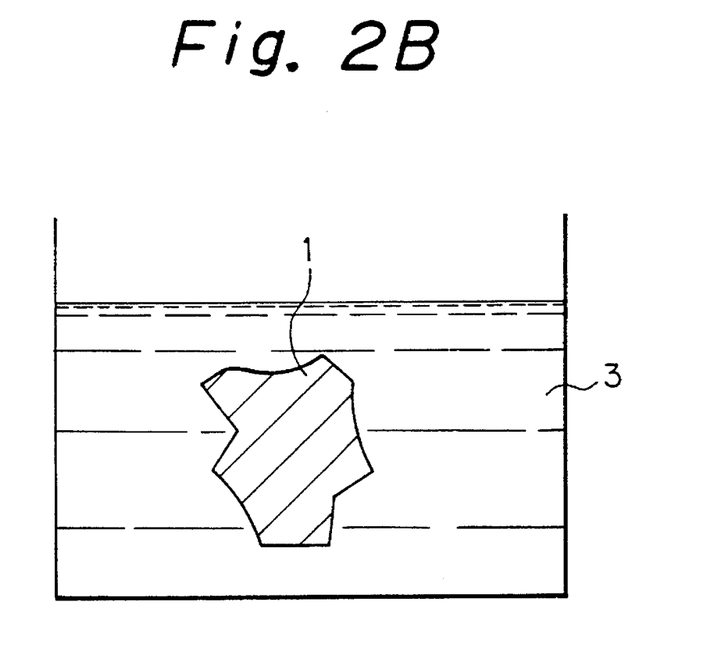

In all above cases and cases where the particle size was varied, the oxide film 2 of the non-spherical particles 1 was removed while the shape of the non-spherical particles 1 was not changed to spherical particles, as shown in FIG. 2B.

Example 5

In the same procedures as Examples 1 to 3, spherical solder particles of In-40Pb having a particle size of 20 to 45 μm were subject to the oxide film removal treatment.

40 g of rosin (s.p., 72°–82° C.), 10 g of ethylene glycol monobutyl ether, 9 g of diethylene glycol mono-n-butyl ether and 1 g of hardened caster oil were mixed to form a flux vehicle.

90 g of the above spherical solder particles and 10 g of the above flux vehicle were then mixed together to form a solder paste.

The solder paste was screen printed onto a circuit board and then heated to a temperature of 215° C. for reflow by a VPS (vapor phase soldering) method. Good pre-soldering was made without formation of solder balls.

Example 6

| | |
|---|---|
| Rosin: Polymerized rosin (Harimac AS-5) | 150 g |
| Organic solvent: Diethylene glycol monobutyl ether | 80 g |

The rosin and organic solvent were mixed and heated to form a uniform mixture. Then, 50 g of the thus formed mixture and 50 g of Pb-5Sn having a melting point of 300° to 314° C. were mixed and heated in perfluorocarbon vapor to 260° C. to remove the oxide film from the solder particles.

Similarly, 30 g of Pb-3.5Ag-1.5Sn having a melting point (more Specifically the liquid releasing temperature) of 300°–309° C. was mixed with 50 g of the above mixture of the rosin and organic solvent, and the resultant mixture was heated in a melted solder tank held at 350° C., to heat the mixture to a temperature of 302° C., to thereby remove the oxide film from the solder particles.

The thus formed tarnish-free solder particles and Au-20Sn particles, the latter being originally tarnish free, were mixed with tetraethylene glycol in the following compositions:

| | |
|---|---|
| (1) Pb-5Sn (m.p., 300–314° C. | 25 g |
| tetraethylene glycol (b.p., 327° C.) | 2 g |
| (2) Pb-3.5Ag-1.5Sn (b.p., 300–309° C.) | 25 g |
| tetraethylene glycol (b.p., 327° C.) | 2 g |
| (3) Au-20Sn (m.p., 280° C.) | 25 g |
| tetraethylene glycol (m.p., 327° C.) | 2 g |

Three solder pastes thus made were coated over an Au metallized substrate and heated to 350° C. for pre-soldering.

The pre-soldering could be conducted without any problems such as splash or scattering of solder particles or formation of solder balls. Further, the organic solvent disappeared after the pre-soldering.

Thus, it was confirmed that soldering without an activator and without necessity of flux cleaning can be conducted.

Example 7

Pre-solderings of Pb-5Sn having a diameter of 100 μm were formed onto an LSI chip and treated with a flux to remove the oxide film on the surface of the pre-solderings and then cleaned by a solvent.

Tetraethylene glycol having a boiling point of 327° C. was coated over the pre-solderings. A circuit board with an Au metallization was brought into contact with the coated pre-solderings and the assembly was heated up to a temperature of 350° C.

In order to observe the state of the soldering, the LSI chip was peeled from the circuit board and it was found that the solder wetted the circuit board and that the organic solvent disappeared.

Example 8

Pre-solderings of Sn-37Pb having a diameter of 100 μm were formed onto an LSI chip and cleaned with a flux to remove the oxide film on the surface of the pre-solderings.

Diethylene glycol monoethyl ether having a boiling point of 201.9° C. was coated over the pre-solderings. A circuit board with an Au metallization was brought into contact with the coated pre-solderings and the assembly was heated up to a temperature of 215° C.

In order to observe the state of the soldering, the chip was peeled from the circuit board and it was found that the solder wetted the circuit board and that the organic solvent had disappeared.

FIGS. 3A to 6 are photographs showing the results of Examples.

Figure 3A:
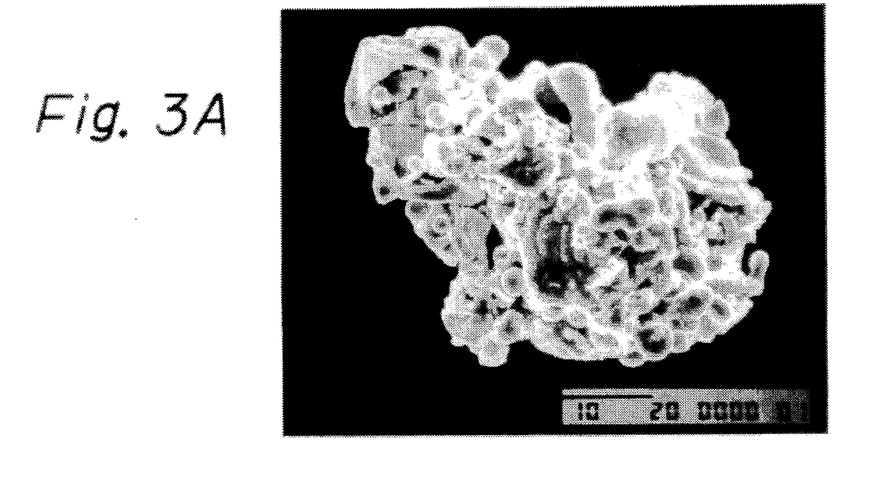
FIGS. 3A, 3B, 3C, and 3D show the solder particles before and after the oxide film-removing treatment.
Figure 3B:
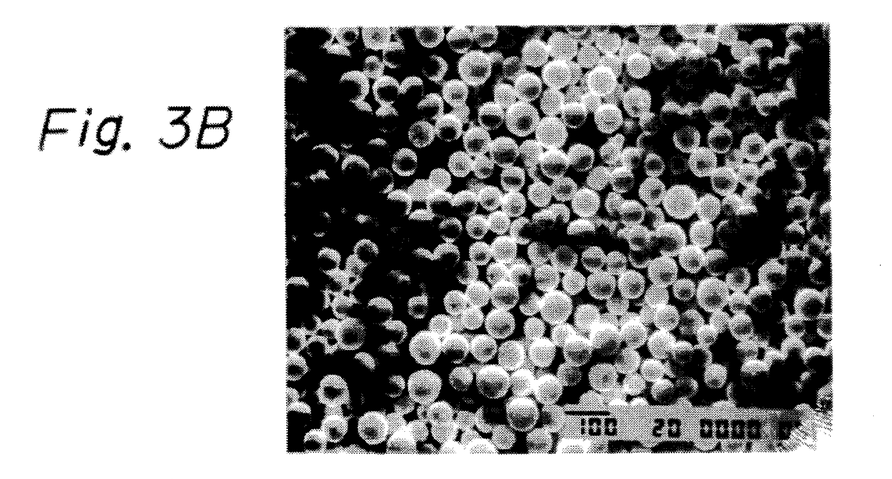
Figure 3C:
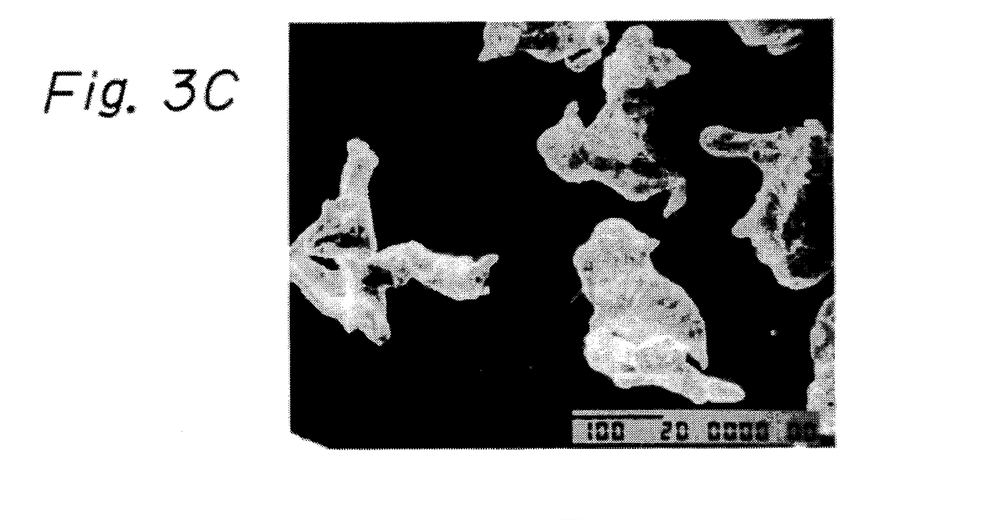
Figure 3D:
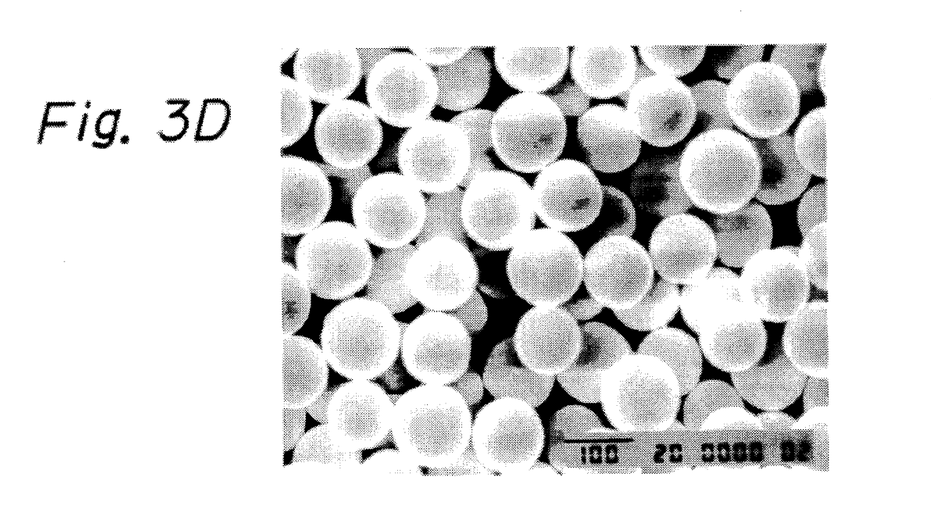

FIGS. 3A and 3B show the In-40Pb solder particles before and after the treatment as described in Example 1. FIGS. 3C and 3D show the In-48Sn solder particles before and after the treatment similar to that as described in Example 1. Note the particle sizes of the In-40Pb and In-48Sn solder particles are not the same as in Example 1. It is seen that excellent spherical solder particles were obtained in accordance with the present invention.

Figure 4A:
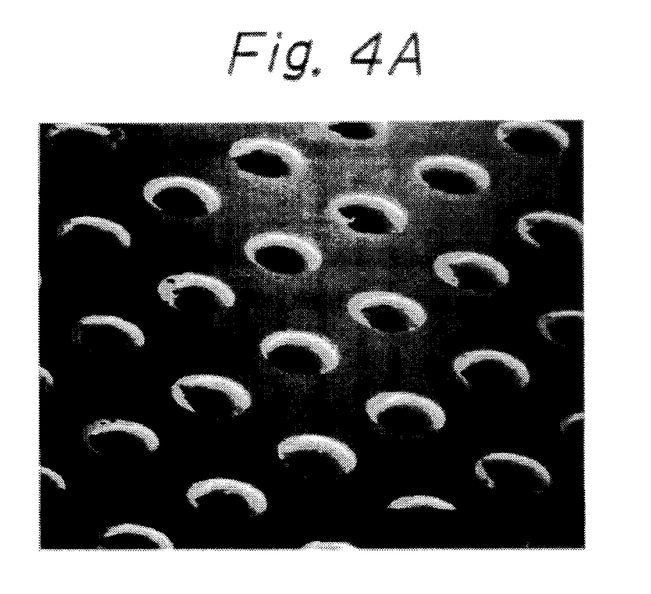
FIGS. 4A, 4B, 4C, and 4D show solder patterns obtained using solder particles with an activator, the solder particles being produced by the oxide film-removing treatment.
Figure 4B:
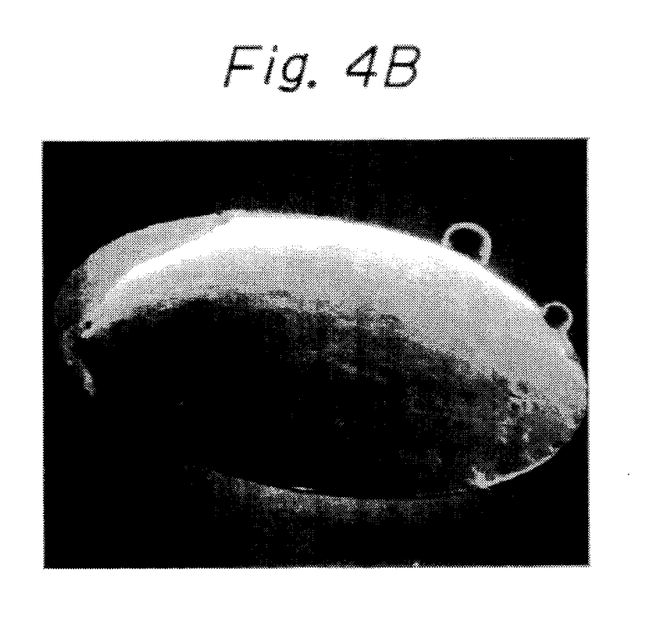
Figure 4C:
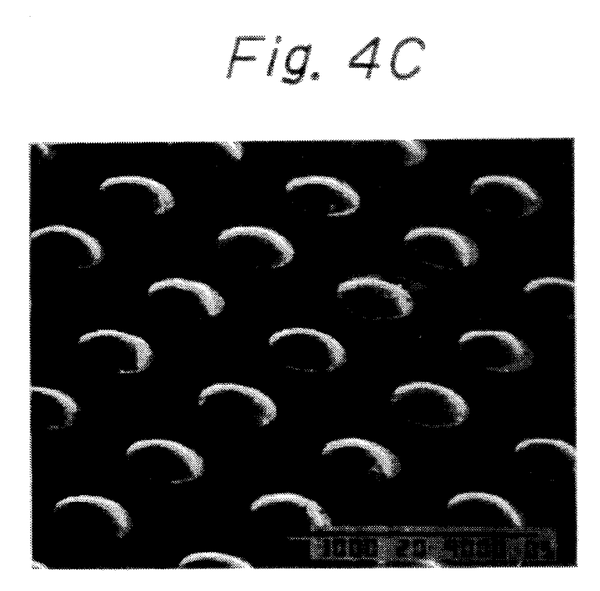
Figure 4D:
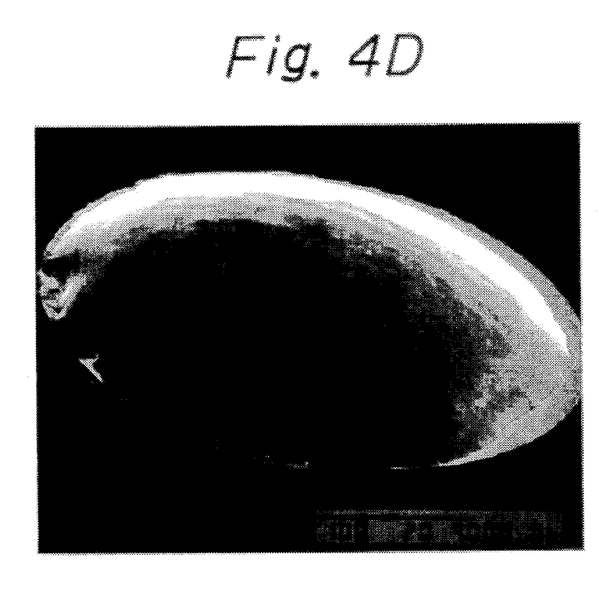

FIGS. 4A and 4B show solder patterns and an enlarged solder pattern which were obtained from forming a solder paste comprising spherical tarnish-free In-48Sn particles, a rosin, a hardened caster oil, an organic solvent and an activator, storing the solder paste for one day and then soldering the same in the ball pattern. FIGS. 4C and 4D show similar solder patterns and an enlarged solder pattern as in FIGS. 4A and 4B that were obtained after storing for 30 days. It is seen that excellent patterns were obtained when using solder particles produced by the method in accordance with the present invention, even if mixed with an activator and stored for a long time.

Figure 5:
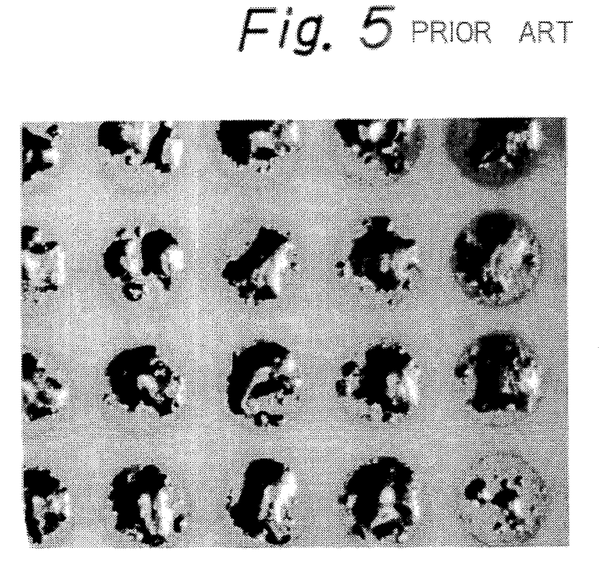
FIG. 5 shows solder patterns obtained using commercially available particles.

FIG. 5 shows solder patterns that were similar to those as shown in FIGS. 4A and 4B except that the solder used was commercially available atomized In-48Sn particles, i.e, having a relatively thick oxide film. It is seen that the solder patterns were obtained but were inferior to those in FIGS. 4A and 4B. Further, it is noted that the same solder paste used for FIG. 5 could not be printed at all when used after being stored for a few days because it was too viscous or thick.

Figure 6:
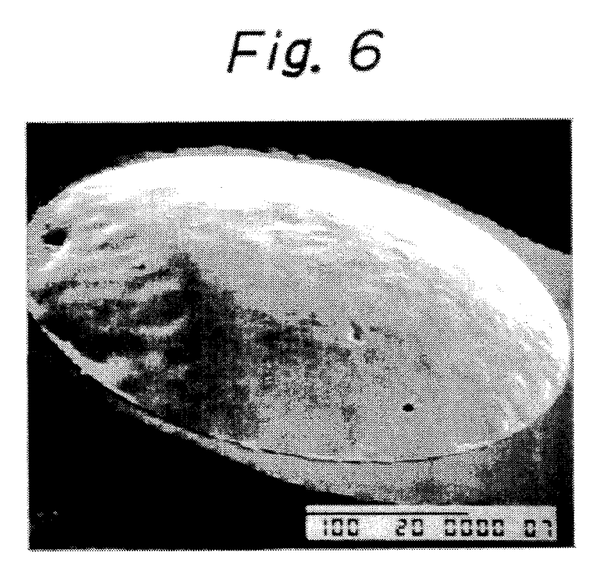
FIG. 6 shows a solder pattern obtained using solder particles without an activator, the solder particles being produced by the oxide film-removing treatment.

FIG. 6 shows an enlarged solder pattern which was obtained from forming a solder paste comprising spherical tarnish-free In-40Pb particles, a rosin, a hardened caster oil, and an organic solvent but not containing an activator. It shows that excellent soldering can be achieved without an activator and thus flux cleaning can be also eliminated in accordance with the present invention.

Figure 7:
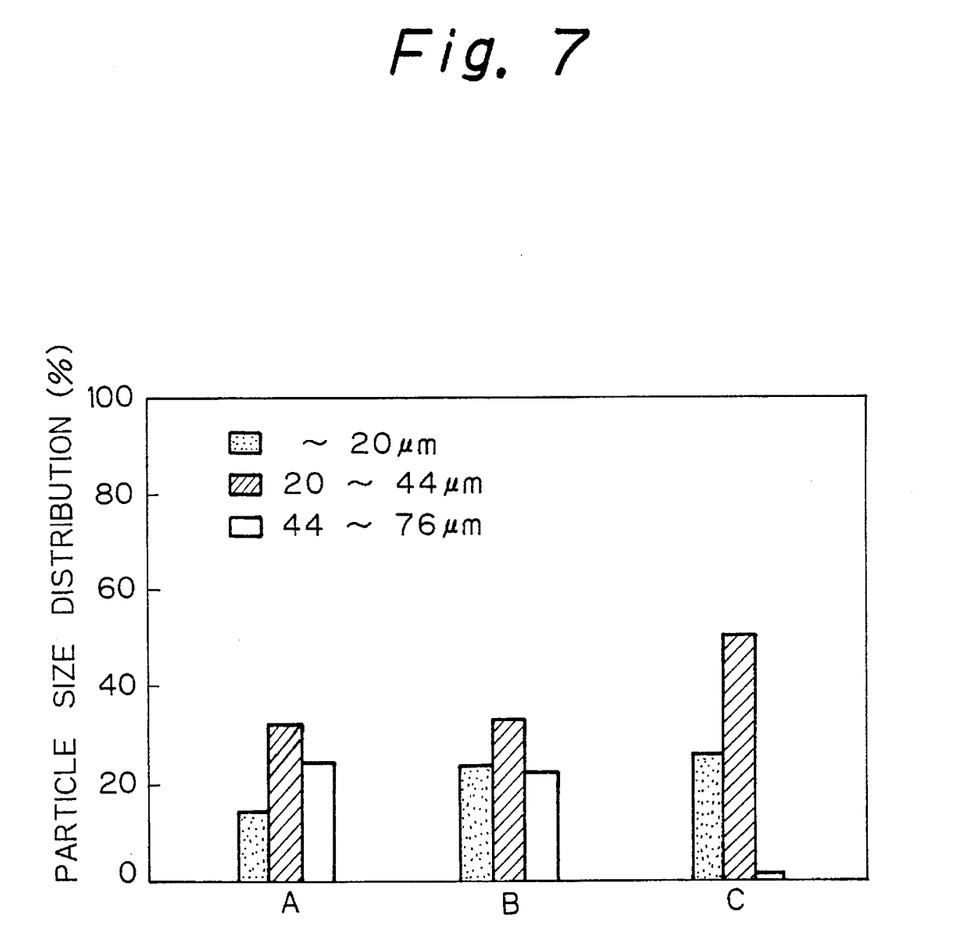
FIG. 7 shows the particle size distribution of solder particles treated by three heating media.

Further, FIG. 7 shows the particle size distribution of solder particles treated by the following three heating media A, B and C:

Heating medium A: a rosin only.

Heating medium B: a rosin and hardened caster oil.

Heating medium C: a low softening rosin and a high softening point rosin.

It is seen that the particle size increase of solder powders can be prevented by using a high softening point rosin together with a low softening point rosin. It should be noted that the original solder powders treated had some particle size distribution.

FIGS. 8a to 8E illustrate the formation and use of a solder paste comprising tarnish-free solder powders 11 and an organic solvent 12 having a boiling point higher than the melting point of the solder powders.

Figure 8A:
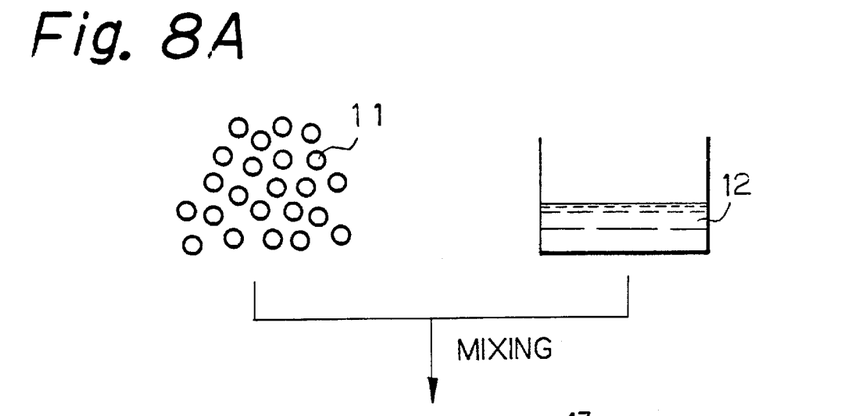
FIGS. 8A, 8B, 8C, 8D, and 8E show preparation and use of a solder paste without an activator.
Figure 8B:
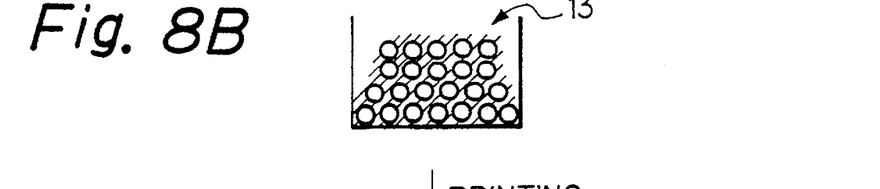
Figure 8C:
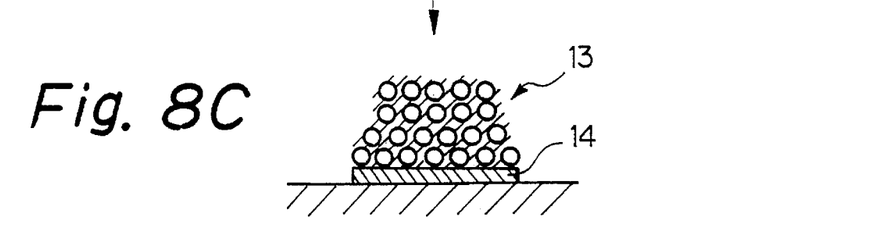

The tarnish-free solder powders 11 and an organic solvent 12 are mixed to form a solder paste 13 in which the surface of the solder powders 11 are covered with the organic solvent 12 (FIGS. 8A and 8B). The solder paste 13 thus formed is then printed onto a portion 14 to be soldered (FIG. 8C).

Figure 8D:
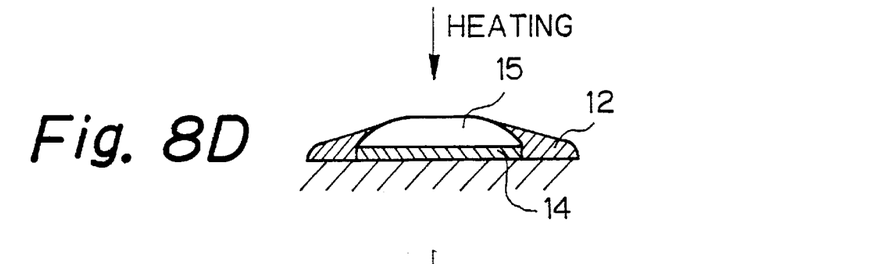
Figure 8E:
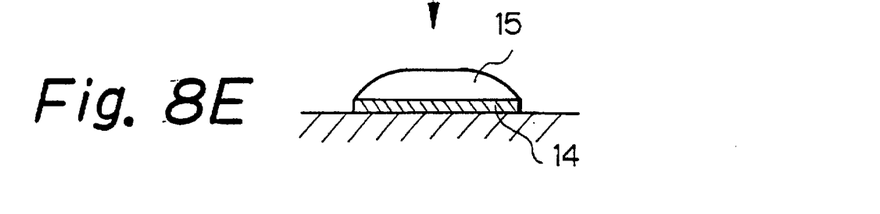

By heating the solder paste 13 on the portion 14 to a temperature above the boiling point of the organic solvent, the solder powders are melted to form a pre-soldering or solder bump 15 (FIG. 8D). Since the tarnish-free solder powders 11 are used and the organic solvent 12 protects the solder powders 11 from the oxidation thereof up to the melting point of the solder powers, the soldering can be conducted without an activator. The organic solvent 12 is evaporated during the heating of the soldering (pre-soldering in this case) (FIG. 8E).

FIGS. 9A to 9E illustrate a flux-cleaningless soldering method in accordance with the present invention.

Figure 9A:
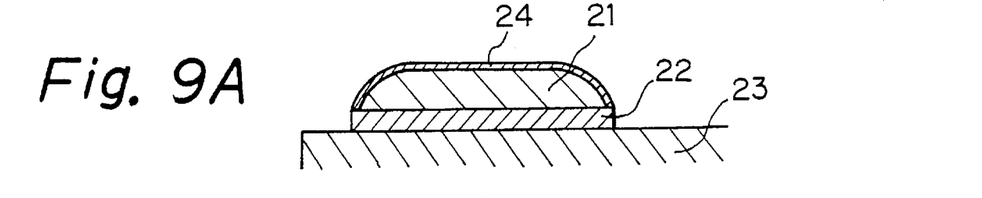
FIGS. 9A, 9C, 9D, and 9E show a soldering method which enables elimination Of flux cleaning after soldering.
Figure 9B:
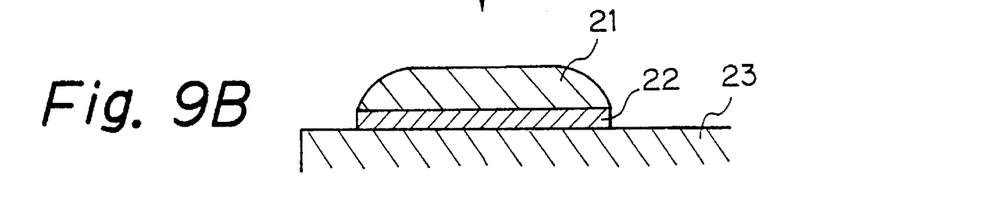

A pre-soldering or solder bump 21 is first formed on a portion to be soldered 22 of an LSI 23. The pre-soldering 21 may have a thick oxide film 24 formed during the pre-soldering(FIG. 9A). The oxide film 24 is removed by treating with a flux and the surface of the pre-soldering 21 is cleaned with an organic solvent(FIG. 9B).

Figure 9C:
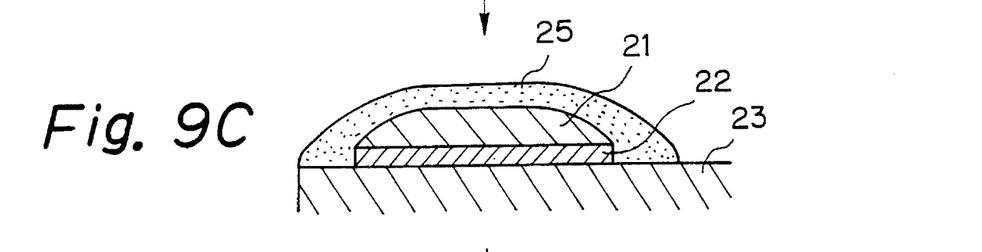
Figure 9D:
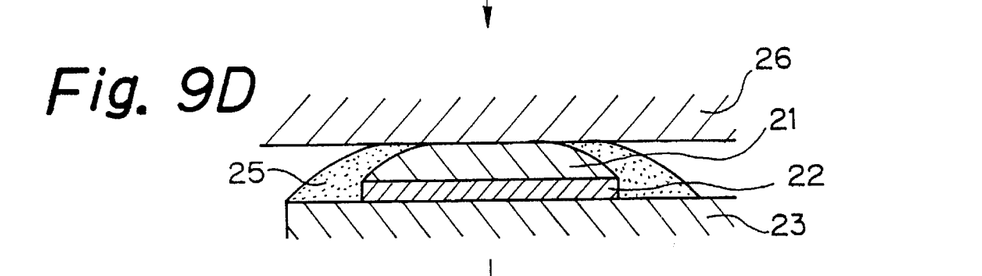

The cleaned pre-soldering 21 is covered with an organic solvent 25 having a boiling point higher than the melting point of the solder 21 (FIG. 9C). The organic solvent 25 is a protecting coating of the pre-soldering 21 having a tarnish-free surface from oxidation during the next soldering. A circuit board 26 is brought into contact with the pre-soldering 21 of the LSI 23 (FIG. 9D).

Figure 9E:
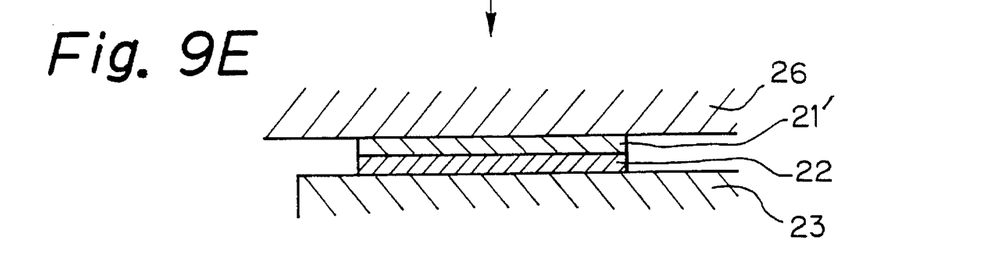

The assembly of the circuit board 26 and LSI 23 with the pre-soldering 21 is then heated to a temperature above the boiling point of the organic solvent, to thereby bond the LSI 23 to the circuit board 26 with the solder 21' and evaporate the organic solvent (FIG. 9E).

We claim:

1. A method for making a solder metal particle spherical, comprising immersing a solder metal particle having an oxide film on a surface thereof in a heating medium consisting essentially of a rosin and an organic solvent without any activator, the solder metal particle having a melting point and the organic solvent having a boiling point higher than the melting point of the solder metal particle, and then heating the solder metal particle in the heating medium to a temperature above the melting point of the solder metal particle, thereby removing the oxide film.

2. A method according to claim 1, wherein the solder is one selected from the group consisting of InSn, SnPb, InPb and In.

3. A method according to claim 1, wherein the metal particle is a solder produced by an atomization method.

4. A method for making a solder metal particle spherical, comprising immersing a solder metal particle having an oxide film on a surface thereof in a heating medium consisting essentially of a rosin, hardened castor oil and an organic solvent without any activator, the solder metal particle having a melting point and the organic solvent having a boiling point higher than the melting point of the solder metal particle, and then heating the solder metal particle in the heating medium to a temperature above the melting point of the solder metal particle, thereby removing the oxide film while substantially preventing melting together or unifying a plurality of said solder metal particles resting on the bottom of a tank containing the heating medium.

5. A method according to claim 4, wherein the solder is one selected from the group consisting of InSn, SnPb, and In.

6. A method according to claim 4, wherein the metal particle is a solder produced by an atomization method.

7. A method according to claim 4, wherein the rosin has a softening point of about 80° C.

8. A method for making a solder metal particle spherical, comprising immersing a solder metal particle having an oxide film on a surface thereof in a heating medium consisting essentially of at least two rosins having substantially different softening points and an organic solvent without any activator, the solder metal particle having a melting point and the organic solvent having a boiling point higher than the melting point of the solder metal particle, and then heating the solder metal particle in the heating medium to a temperature above the melting point of the solder metal particle, thereby removing the oxide film while substantially preventing melting together or unifying a plurality of said solder metal particles resting on the bottom of a tank containing the heating medium.

9. A method according to claim 8, wherein the solder is one selected from the group consisting of InSn, SnPb and In.

10. A method according to claim 8, wherein the solder metal particle is a solder produced by an atomization method.

11. A method according to claim 8, wherein one of said at least two rosins has a softening point of about 80° C., and the other of said at least two rosins has a softening point of at least 100° C.

12. A method for removing an oxide film of a solder metal, comprising immersing a solder metal having an oxide film on a surface thereof and having a melting point higher than 280° C. in a heating medium consisting essentially of a rosin in an alcohol, the heating medium not containing an activator, and then heating the solder metal in the heating medium to a temperature below the melting point of the solder metal in a range of 250° to 280° C.

13. A method according to claim 12, wherein the solder is one selected from the group consisting of Au-20Sn, Pb-3.5Ag-1.5Sn, and Pb-5Sn.

14. A method according to claim 12, wherein the solder metal is a solder produced by an atomization method.

* * * * *